United States Patent [19]

Johnson et al.

[11] Patent Number: 4,922,549

[45] Date of Patent: May 1, 1990

[54] DIGITAL FM SQUELCH DETECTOR

[75] Inventors: Mark J. Johnson, Algonquin; Francis R. Yester, Jr., Arlington Heights; Steven C. Jasper, Hoffman Estates, all of Ill.

[73] Assignee: Motorola, Inc., Schaumburg, Ill.

[21] Appl. No.: 265,367

[22] Filed: Oct. 27, 1988

[51] Int. Cl.$^5$ .............................................. H04B 1/10
[52] U.S. Cl. .................................. 455/212; 455/221; 455/226; 375/104
[58] Field of Search ................. 455/62, 212, 221, 226; 375/104; 329/120

[56] References Cited

U.S. PATENT DOCUMENTS 3,894,285  7/1975  Schaeperkoetter ................. 455/213
4,532,636  7/1985  Wilkinson .......................... 375/104
4,648,126  3/1987  Toffolo ............................... 455/212
4,704,736  11/1987  Kasser ................................. 375/104
4,724,545  2/1988  Hamada .............................. 455/212
4,783,845  11/1988  McChesney et al. ............... 375/104

Primary Examiner—Joseph A. Orsino
Assistant Examiner—Frank M. Scutch, III
Attorney, Agent, or Firm—Wayne J. Egan

[57] ABSTRACT

A method is disclosed for determining when a frequency-modulated expected information signal resides at a predetermined channel. The method is based on determining a value based on the frequency deviation of the received signal, and then comparing the value with a threshold based on the expected information signal. The method is particularly well-suited for use as a squelch detector in digital FM radios.

24 Claims, 2 Drawing Sheets

DIGITAL FM SQUELCH DETECTOR

TECHNICAL FIELD

This invention relates generally to FM radio communications.

BACKGROUND ART

Radio communication based on frequency modulation of an information signal of interest are well known in the art. To date, most such radios have been analog based. Nevertheless, some progress has been made in digitizing at least a portion of the reception, demodulation and/or audio processing functions of such a radio.

Implementation of a conventional squelch detector in such a digital radio creates a number of problems. Since the discriminator output of such a radio is sampled at audio rates, it cannot support the high-frequency (20–50 kHz) noise criterion that a conventional squelch uses for detecting channel activity. Further, the conventional squelch requires that the discriminator be operational. As a result, a digital FM radio needs to devote a substantial amount of its resources to implement a conventional squelch detector.

SUMMARY OF THE INVENTION

Notwithstanding these teachings of the prior art, the applicant has discovered a squelch detector particularly well-suited for use in a digital FM radio. According to the invention, the detector operates directly on the IF samples and, therefore, it requires neither the discriminator nor the large IF filter needed for conventional squelch detectors. As a result, this detector requires a significantly smaller portion of a digital FM radio's resources to implement, as compared to its conventional counterpart.

According to the invention, the detector uses the phase ordering of FM signals to differentiate between signal and noise on the channel.

In an FM radio, an ideal on-channel signal may be represented as a constant-amplitude phasor rotating about the origin at a speed determined by the instantaneous deviation of the signal. In the zero-IF case, this speed may be positive or negative, necessitating that the received signal be represented by complex I and Q channels. In the presence of an on-channel signal, the maximum speed of rotation of the phasor is limited by the maximum deviation of the incoming signal.

In the absence of a signal, on the other hand, the I and Q channels will contain Gaussian noise and, as a result, the rotational speed of the phasor becomes a random variable dependent on the noise shaping and Nyquist bandwidth of the input signal. Since the bandwidth of the input samples is necessarily much larger than that of an on-channel signal, the average rotational speed of the noise phasor is measurably larger than that of an on-channel signal.

As a result, the applicant has discovered that the presence of signal on the channel may be detected by measuring the rotational speed of the received signal phasor. The applicant has further discovered that the phasor speed may be estimated by counting the number of times per unit time a particular component (I or Q) equals a predetermined number. In the preferred embodiment of the invention, this predetermined number equals zero, and so the phasor speed is estimated by counting the number of I or Q component zero-crossings per unit time.

DETAILED DESCRIPTION OF THE INVENTION

Figure 1:
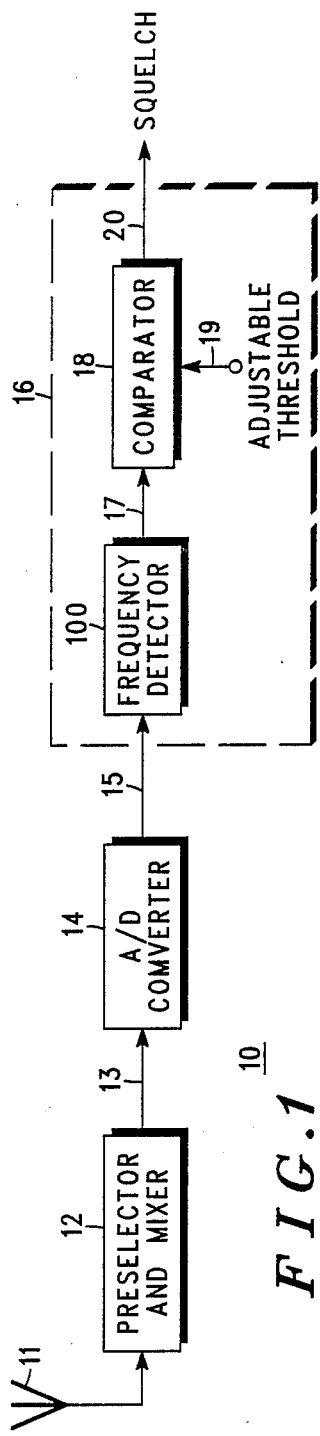
FIG. 1 depicts the digital FM squelch detector (10), including the frequency detector (100).

FIG. 1 depicts the digital FM squelch detector (10). This description will presume provision of an information signal that is frequency modulated on an allocated channel having a predetermined bandwidth of approximately ±12.5 kHz ($\pm f_{MAX}$). This FM signal will be received by an antenna (11) and provided to a preselector and mixer circuit (12) to be processed in a manner well understood in the prior art. In this embodiment, it can be presumed that the output (13) of the preselector and mixer block (12) will comprise the information signal as frequency modulated on a 450 kHz carrier. This signal (13) will then be provided to an analog to digital converter (14). This A to D converter (14), for example, may be a sigma delta convertor as described in prior pending U.S. application Ser. No. 149,350, filed Jan. 28, 1988, now U.S. Pat. No. 4,857,928 which pending application and the present application are both commonly owned and assigned to the same assignee, and which pending application is incorporated herein by reference. This A to D converter (14) provides a digital output stream of I and Q samples of the received signal (15). This A to D converter (14) can have a sampling rate of, for example, 33⅓kHz, thereby providing digital samples (15) at the rate of one complex sample (I component plus Q component) per 30 microseconds.

The output (15) of this A to D converter (14) is then appropriately provided to a digital signal processor (hereinafter the "DSP") (16) as provided through use, for example, of a 56000 part manufactured by Motorola, Inc. This part may be programmed in accordance with user's manual #DSP56000UM/AD, also available from Motorola, Inc. With appropriate programming, the DSP (16) provides a frequency detector (100) and a comparator (18).

The frequency detector (100) is arranged to provide a value (17) based on the phasor speed of the received signal (15). This value (17) is then applied to a comparator (18), which is well understood in the prior art, and which compares the value (17) with an adjustable threshold (19). If the value (17) is less than the threshold (19), this corresponds to channel activity and, as a result, the comparator (18) opens the squelch detect output (20). Otherwise, if the value (17) exceeds the threshold (19), this corresponds to no channel activity and, as a result, the comparator (18) closes the squelch detect output (20).

The threshold (19) may be adjusted to a value based on both the minimum acceptable signal level and the type of expected signal (for example: voice, music, or data). For example, if minimum acceptable signal level is 12 dB SINAD and the type of expected signal is voice, the threshold (19) should be adjusted until the squelch opens on a 12 dB SINAD voice signal.

Figure 2:
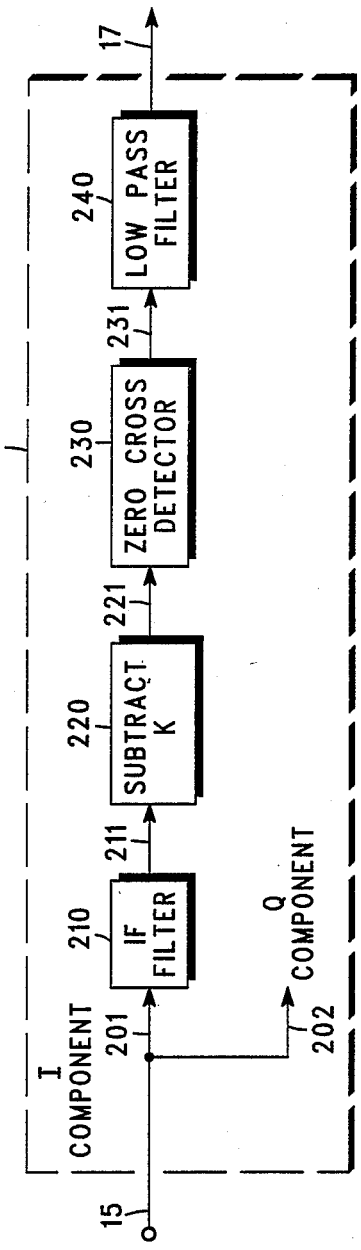
FIG. 2 depicts a first embodiment (200) of the frequency detector.

FIG. 2 depicts a first embodiment (200) of the frequency detector (100) of FIG. 1. This embodiment provides a value (17) based on the phasor speed of the received signal (15) by counting the number of times one component (either I or Q) of the received signal equals a predetermined value, k. In the following, it is assumed the I component is chosen.

The I component (201) is input to a simplified IF filter (210). This type of filter is well understood in the prior art, its purpose being to filter out the adjacent channels. Assuming a 25 KHz channel spacing, a suitable filter (210) has an impulse response of the form $H(z) = 1 + z^{-1} + z^{-2}$.

Next, a constant k is subtracted (220) from the filter output (211). The value of k is equal to the I (or Q) axis used to measure the speed of the rotating phasor. In the preferred embodiment, k=0. The output from this process (221) is then input to a zero-crossing detector (230), which is well understood in the prior art. A suitable detector (230) is one whose output (231) equals a constant value for a constant time duration for any zero-crossing event. The output (231) is then input to a low-pass filter (240). This type of filter is well understood in the prior art, its purpose being to integrate the zero-crossing detector outputs (231) over time. A suitable filter has an impulse response of the form $H(z) = 1/(z-n)$, where $0.99 < n < 0.999$. The output (17) of this low-pass filter (240) is subsequently input to the comparator (18) of FIG. 1.

Figure 3:
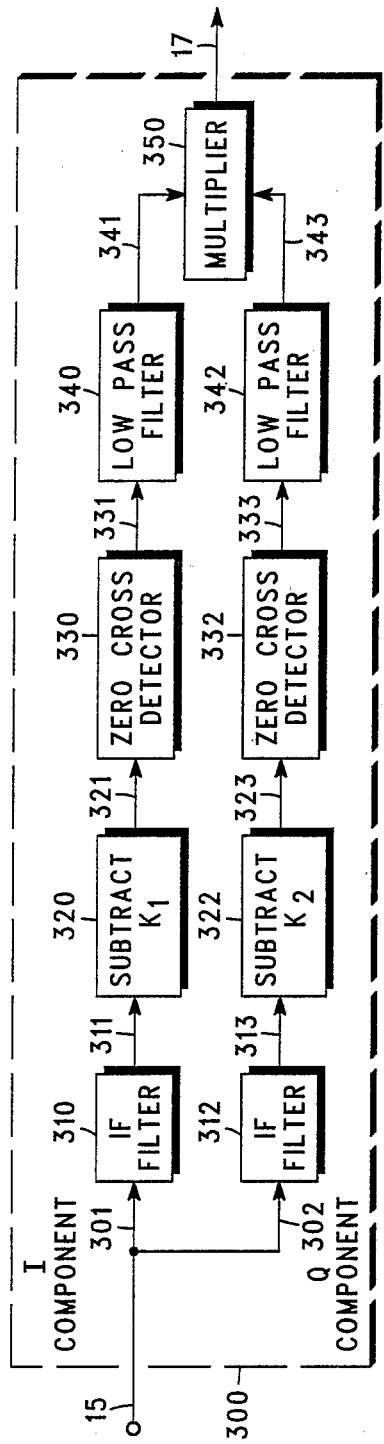
FIG. 3 depicts a second embodiment (300) of the frequency detector.

FIG. 3 depicts a second embodiment (300) of the frequency detector (100) of FIG. 1. This embodiment provides a value (17) based on the phasor speed of the received signal (15) by counting the number of times the I component of the received signal equals a first predetermined value, $k_1$, and by counting the number of times the Q component of the received signal equals a second predetermined value, $k_2$.

The I component (301) is input to a first simplified IF filter (310), which is identical to the simplified IF filter (210) of FIG. 2. Next, a constant $k_1$ is subtracted (320) from the filter output (311). The value of $k_1$ is equal to the I-axis used to measure the speed of the rotating phasor. In the preferred embodiment, $k_1 = 0$. The output from this process (321) is then input to a first zero-crossing detector (330), which is identical to the zero-crossing detector (230) of FIG. 2. The output (331) of the first zero-crossing detector (330) is then input to a first low-pass filter (340), which is identical to the low-pass filter (240) of FIG. 2. The output (341) of this first low-pass filter (340) is then provided as a first input to the multiplier (350), which multiplier is well understood in the prior art.

Similarly, the Q component (302) is input to a second simplified IF filter (312), which is identical to the first simplified IF filter (310). Next, a constant $k_2$ is subtracted (322) from the filter output (313). The value of $k_2$ is equal to the Q-axis used to measure the speed of the rotating phasor. In the preferred embodiment, $k_2 = 0$. The output from this process (323) is then input to a second zero-crossing detector (332), which is identical to the first zero-crossing detector (330). The output (333) of the second zero-crossing detector (332) is then input to a second low-pass filter (342), which is identical to the first low-pass filter (340). The output (343) of the second low-pass filter (342) is then provided as a second input to the multiplier (350).

Finally, the output (17) of the multiplier (350) is input to the comparator (18) of FIG. 1.

Figure 4:
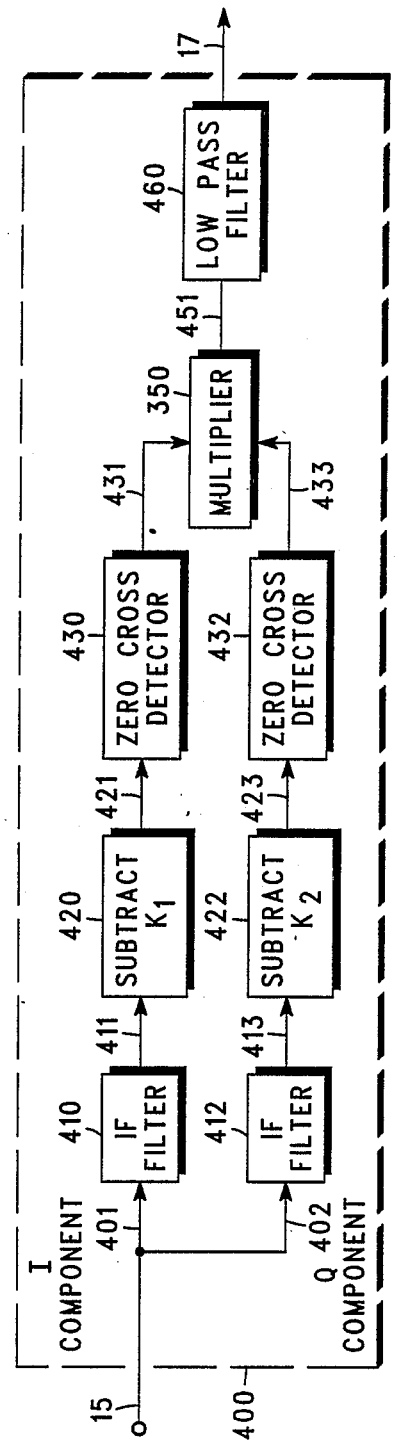
FIG. 4 depicts a third embodiment (400) of the frequency detector.

FIG. 4 depicts a third embodiment (400) of the frequency detector (100) of FIG. 1. This embodiment provides a value (17) based on the phasor speed of the received signal (15) by counting the number of times the I component of the received signal equals a first predetermined value, $k_1$, and the Q component of the received signal equals a second predetermined value, $k_2$, at the same time.

The I component (401) is input to a first simplified IF filter (410) which is identical to the simplified IF filter (210) of FIG. 2. Next, a constant $k_1$ is subtracted (420) from the filter output (411). The value of $k_1$ is equal to the I-axis used to measure the speed of the rotating phasor. In the preferred embodiment, $k_1 = 0$. The output from this process (421) is then input to a first zero-crossing detector (430), which is identical to the zero-crossing detector (230) of FIG. 2. The output (431) of the first zero-crossing detector (430) is then provided as a first input to the multiplier (450), which is identical to the multiplier (350) of FIG. 3.

Similarly, the Q component (402) is input to a second simplified IF filter (412) which is identical to the first simplified IF filter (410). Next, a constant $k_2$ is subtracted (422) from the filter output (413). The value of $k_2$ is equal to the Q-axis used to measure the speed of the rotating phasor. In the preferred embodiment, $k_2 = 0$. The output from this process (423) is then input to a second zero-crossing detector (432), which is identical to the first zero-crossing detector (430). The output (433) of the second zero-crossing detector (432) is then provided as a second input to the multiplier (450).

The output (451) of the multiplier (450) is then input to a low-pass filter (460), which is identical to the low-pass filter (240) of FIG. 2. Finally, the output (17) of the low-pass filter (460) is input to the comparator (18) of FIG. 1.

I claim:

1. A method of determining when a frequency-modulated expected information signal resides at a predetermined channel comprising the steps of:
    (a) providing a received IF signal from said predetermined channel, said received IF signal being frequency-modulated;
    (b) determining a value for said received IF signal based at least in part on the frequency deviation of said received IF signal; and
    (c) comparing said value with a threshold based at least in part on a characteristic of said expected information signal.
    wherein said received IF signal includes quadrature components and said step of determining a value for said received IF signal includes determining the number of times at least one quadrature component of said received IF signal at least substantially equals a first predetermined number.

2. The method of claim 1 wherein said first predetermined number equals zero.

3. The method of claim 2 including the step of squelching a radio responsive to said comparing step.

4. The method of claim 3 wherein said received IF signal is in the form of a digital bit stream.

5. A method of determining when a frequency-modulated expected information signal resides at a predetermined channel, comprising the steps of:
    (a) providing a received IF signal from said predetermined channel, said received IF signal being frequency-modulated;

(b) determining a value for said received IF signal based at least in part on the frequency deviation of said received IF signal; and (c) comparing said value with a threshold based at least in part on a characteristic of said expected information signal.

wherein said received IF signal includes quadrature components and said step of determining a value for said received IF signal includes determining the number of times a first quadrature component of said received IF signal at least substantially equals a first predetermined number and the number of times a second quadrature component of said received IF signal at least substantially equals a second predetermined number.

6. The method of claim 5 wherein said first predetermined number and said second predetermined number equal zero.

7. The method of claim 6 including the step of squelching a radio responsive to said comparing step.

8. The method of claim 7 wherein said received IF signal is in the form of a digital bit stream.

9. A method of determining when a frequency-modulated expected information signal resides at a predetermined channel, comprising the steps of:

(a) providing a received IF signal from said predetermined channel, said received IF signal being frequency-modulated;

(b) determining a value for said received IF signal based at least in part on the frequency deviation of said received IF signal; and (c) comparing said value with a threshold based at least in part on a characteristic of said expected information signal, wherein said received IF signal includes quadrature components and said step of determining a value for said received IF signal includes determining the number of times a first quadrature component of said received IF signal at least substantially equals a first predetermined number and a second quadrature component of said received IF signal at least substantially equals a second predetermined number at substantially the same time.

10. The method of claim 9 wherein said first predetermined number and said second predetermined number equal zero.

11. The method of claim 10 including the step of squelching a radio responsive to said comparing step.

12. The method of claim 11 wherein said received IF signal is in the form of a digital bit stream.

13. A radio having signal determining means for determining when a frequency-modulated expected information signal resides at a predetermined channel, said signal determining means comprising:

receiving means for providing a received IF signal from said predetermined channel, said received IF signal being frequency-modulated;

value determining means responsive to said receiving means for determining a value for said received IF signal based at least in part on the frequency deviation of said received IF signal; and comparing means responsive to said value determining means for comparing said value with a threshold based at least in part on a characteristic of said expected information signal, wherein said received IF signal includes quadrature components and said value determining means includes means responsive to said receiving means for determining the number of times at least one quadrature component of said received IF signal at least substantially equals a first predetermined number.

14. The radio of claim 13 wherein said first predetermined number equals zero.

15. The radio of claim 14 including
squelching means responsive to said comparing means for squelching said radio.

16. The radio of claim 15 wherein said received IF signal is in the form of a digital bit stream.

17. A radio having signal determining means for determining when a frequency-modulated expected information signal resides at a predetermined channel, said signal determining means comprising:

receiving means for providing a received IF signal from said predetermined channel, said received IF signal being frequency-modulated;

value determining means responsive to said receiving means for determining a value for said received IF signal based at least in part on the frequency deviation of said received IF signal; and comparing means responsive to said value determining means for comparing said value with a threshold based at least in part on a characteristic of said expected information signal, wherein said received IF signal includes quadrature components and said value determining means includes means responsive to said receiving means for determining the number of times a first quadrature component of said received IF signal at least substantially equals a first predetermined number and the number of times a second quadrature component of said received IF signal at least substantially equals a second predetermined number.

18. The radio of claim 17 wherein said first predetermined number and said second predetermined number equal zero.

19. The radio of claim 18 including
squelching means responsive to said comparing means for squelching said radio.

20. The radio of claim 19 wherein said received IF signal is in the form of a digital bit stream.

21. A radio having signal determining means for determining when a frequency-modulated expected information signal resides at a predetermined channel, said signal determining means comprising:

receiving means for providing a received IF signal from said predetermined channel, said received IF signal being frequency-modulated;

value determining means responsive to said receiving means for determining a value for said received IF signal based at least in part on the frequency deviation of said received IF signal; and comparing means responsive to said value determining means for comparing said value with a threshold based at least in part on a characteristic of said expected information signal.

wherein said received IF signal includes quadrature components and said value determining means includes means responsive to said receiving means for determining the number of times a first quadrature component of said received IF signal at least substantially equals a first predetermined number and a second quadrature component of said received IF signal at least substantially equals a second predetermined number at substantially the same time.

22. The radio of claim 21 wherein said first predetermined number and said second predetermined number equal zero.

23. The radio of claim 22 including squelching means responsive to said comparing means for squelching said radio.

24. The radio of claim 23 wherein said received IF signal is in the form of a digital bit stream.

* * * * *